United States Patent
Funfrock et al.

(10) Patent No.: US 7,283,419 B2
(45) Date of Patent: Oct. 16, 2007

(54) INTEGRATED SEMICONDUCTOR MEMORY

(75) Inventors: Fabien Funfrock, München (DE); Jochen Kallscheuer, München (DE); Michael Bernhard Sommer, Raubling (DE); Christian Stocken, München (DE)

(73) Assignee: Infineon Technologies, AG, Neubiberg (DE)

( * ) Notice: Subject to any disclaimer, the term of this patent is extended or adjusted under 35 U.S.C. 154(b) by 0 days.

(21) Appl. No.: 11/414,554

(22) Filed: May 1, 2006

(65) Prior Publication Data

US 2006/0277379 A1    Dec. 7, 2006

Related U.S. Application Data

(63) Continuation of application No. PCT/DE2004/002410, filed on Oct. 29, 2004.

(30) Foreign Application Priority Data

Oct. 30, 2003  (DE)  ................. 103 50 704
Oct. 20, 2004  (DE)  ............ 10 2004 051 158

(51) Int. Cl.
*G11C 8/00* (2006.01)
(52) U.S. Cl. .................. 365/230.03; 365/230.08; 365/189.12
(58) Field of Classification Search .......... 365/230.03, 365/230.08, 189.12
See application file for complete search history.

(56) References Cited

U.S. PATENT DOCUMENTS

| 5,032,981 | A | 7/1991 | Bril et al. |
| 5,848,431 | A | 12/1998 | Pawlowski |
| 6,064,619 | A | 5/2000 | Ahn et al. |
| 6,404,696 | B1 * | 6/2002 | Oowaki ................. 365/230.03 |

OTHER PUBLICATIONS

ST Microelectronics, "PSDsoft Express and PSD4235 Design Guide Rev 0.1 11.01", *ST Microelectronics Application Note*, An 1356, Sep. 2001, pp. 3-49.

* cited by examiner

*Primary Examiner*—David Lam
(74) *Attorney, Agent, or Firm*—Edell, Shapiro & Finnan LLC

(57) ABSTRACT

An integrated semiconductor memory device includes a first memory zone, a second memory zone, first address connections and a second address connection. A second address signal present at the second address connection specifies the access to the first or second memory zone, whereas it is specified via first address signals at the first address connections which memory cell is accessed within the first or second memory zone. In a first memory configuration, all address connections are driven externally with address signals and the access to a memory cell in the first or second memory zone is controlled. In a second memory configuration, only the first address connections are driven externally whereas a signaling bit in a mode register regulates the access to the first or second memory zone. This provides for access to the second memory zone even if there is no possibility of externally driving the second address connection.

12 Claims, 4 Drawing Sheets

US 7,283,419 B2

INTEGRATED SEMICONDUCTOR MEMORY

CROSS REFERENCE TO RELATED APPLICATIONS

This application is a continuation of PCT/DE02004/002410, filed Oct. 29, 2004, and titled "Semiconductor Integrated Memory," which claims priority German Application No. DE 10 2004 051 158.8, filed on Oct. 20, 2004, and titled "Integrated Semiconductor Memory," and to German Application No. DE 103 50 704.3, filed on Oct. 30, 2003, and titled "Integrated Semiconductor Memory," the entire contents of which are hereby incorporated by reference.

FIELD OF THE INVENTION

The present invention relates to an integrated semiconductor memory having a first and a second memory zone.

BACKGROUND

The continuously increasing complexity of software products requires evermore extensive calculation steps having to be performed in a computer system. This also leads to the necessity of having to process ever increasing volumes of data. For this reason, the semiconductor industry endeavors to develop integrated semiconductor memories, for example DRAM (dynamic random access memory) semiconductor memories which are capable of storing the increasing volume of data. For this reason, the storage capacity of integrated semiconductor memories has been continuously expanded from one memory generation to the next memory generation.

The increased storage capacity hitherto required that the address space of the integrated semiconductor memory also had to be expanded since the memory cells located in the expanded memory zone in comparison with the preceding model of the integrated semiconductor memory have higher addresses. Thus, selecting a memory cell located in this zone of the integrated semiconductor memory requires additional external address connections via which a memory cell in the expanded memory zone is selected.

As long as there are sufficient address connections for driving the integrated semiconductor memory on the main board of a computer, the so-called motherboard, using such an integrated semiconductor memory in a computer does not present problems, as a rule. This generally applies to computers coming from the same generation as the integrated semiconductor memory itself. Similarly, in modern computers, a control circuit, the so called memory controller, will have a sufficient number of driver channels for being able to drive all address connections of the integrated semiconductor memory for accessing memory cells of the integrated semiconductor memory.

However, problems are presented by upgrading a computer of an older generation with integrated semiconductor memories of the new generation if the maximum memory expansion is already installed in such a computer. In general, there are either no longer sufficient connections on a motherboard of such a computer for contacting the integrated semiconductor memory with the expanded memory zone on the mother board or the memory controller of the motherboard is not compatible with the new memory module since it has too few driver channels for driving the integrated semiconductor memory. It is thus not possible to access the expanded memory zone of the integrated semiconductor memory since no further driver channels of the memory controller are available for driving the most significant address connections which are generally required for accessing the expanded memory zone. The computer can no longer be accelerated by means of memory expansion. There is, therefore, a requirement for a memory expansion for a computer so that the integrated semiconductor memory having the greater storage capacity manages with the same number of external address connections as the semiconductor memory having the lesser storage capacity which hitherto existed in the computer.

A further advantage of using memory chips in which it is possible to access the expanded memory zone without also having to drive the most significant address connections lies in the industrial testing of integrated semiconductor memories. The number of driver channels of the test systems used in testing integrated semiconductor memories is limited. Due to this limitation, the parallel testing of integrated semiconductor memories at the end of the production process is restricted. The number of integrated semiconductor memories which can be tested in parallel drops which becomes noticeable negatively in the throughput and, therefore, leads to time losses in the delivery of the parts.

In particular, the testing of the increasing number of memory banks of an integrated semiconductor memory with expanded memory zone has been found to be problematic. Here, too, testing of the additional memory banks is becoming more and more difficult due to the restricted driver resources. The testing of particular addresses, therefore, had to be completely omitted hitherto. The test systems thus only deliver bit fail maps to a restricted extent so that a bank-dependent signature of the analysis is clearly restricted. One possibility of dealing with the problem currently consists in connecting the corresponding address connections in succession by means of jumpers or other additional hardware components. However, using additional hardware represents a very elaborate and complicated solution to the problem.

SUMMARY

The present invention provides an integrated semiconductor memory device with memory expansion in which it is possible to access the memory cell in the expanded memory zone without driving additional address connections of the semiconductor memory which are provided at the package of the semiconductor memory for accessing a memory cell in the expanded memory zone. Furthermore, a method for operating such an integrated semiconductor memory is also provided.

In accordance with the present invention, an integrated semiconductor memory device is provided that can be operated in a first and a second memory configuration. The integrated semiconductor memory device comprises memory cells which are arranged in a first memory zone and in a second memory zone. It also comprises a register to store a signaling bit for identifying access to the first or the second memory zone. It includes first address connections to apply first address signals wherein one of the memory cells within the first or second memory zone can be selected for an access via the first address signals, and a second address connection to apply a second address signal.

The integrated semiconductor memory device further comprises a control circuit to control the integrated semiconductor memory device. The control circuit is constructed in such a manner that it accesses the first or the second memory zone in dependence on the second address signal present at the second address connection in the first memory configuration of the semiconductor memory. The control circuit is further constructed in such a manner that it accesses the first or the second memory zone in dependence on a state of the signaling bit in the second memory configuration of the integrated semiconductor memory.

The integrated semiconductor memory device is operated in the second memory configuration when, for example, a memory controller present on the motherboard of a computer does not have an adequate number of driver channels for addresses in order to access memory cells which are in the expanded memory zone. The second address connection of the integrated semiconductor memory cannot be driven by the memory controller in this case. According to the invention, the memory controller accesses a memory cell in the first or second memory zone of the integrated semiconductor memory by supplying to the integrated semiconductor memory at its first address connections a control signal which sets a signaling bit in a register of the integrated semiconductor memory. In the second memory configuration, the control circuit checks the state of the signaling bit with each access to a memory cell. If the bit is set, the control circuit interprets the address present at the first address connections as address of a memory cell in the expanded memory zone. Thus, the second address connection no longer needs to be driven from externally, for example by a memory controller for selecting a memory cell in the second memory zone as hitherto. In the second memory configuration, the integrated semiconductor memory according to the invention can thus be used largely independently of the hardware present on the motherboard.

In an embodiment of the invention, the integrated semiconductor memory device comprises an address register with first input connections and a second input connection. The control circuit includes a first output connection to output the second address signal. Furthermore, in each case one of the first address connections is in signal connection with in each case one of the first input connections of the address register. The second address signal present at the second address connection is supplied to the second input connection of the address register in the first memory configuration. The first output connection of the control circuit that outputs the second address signal is connected to the second input connection of the address register in the second memory configuration.

In another embodiment of the integrated semiconductor memory device, the control circuit comprises an input connection to apply a configuration signal for initializing the integrated semiconductor memory in the first or the second memory configuration. The control circuit is constructed in such a manner that it operates the integrated semiconductor memory in the first or the second memory configuration when its input connection is driven in dependence on a state of the configuration signal.

A further feature that can be provided for the integrated semiconductor memory device is that the control circuit can be constructed in such a manner that it operates the integrated semiconductor memory in the second memory configuration when the second address signal is present at the second address connection with a potential state.

According to another embodiment of the integrated semiconductor memory device of the invention, the second address connection is connected to a connection that applies the potential state via a transistor or via a bias resistor.

In a further embodiment, the integrated semiconductor memory comprises a controllable switch. The control circuit comprises a second output connection to output a control signal for controlling the controllable switch. In the first memory configuration, the second address signal present at the second address connection is supplied to the second input connection of the address register via the controllable switch. In the second memory configuration, the first output connection of the control circuit is connected to the first output connection of the control circuit to output the second address signal via the controllable switch.

According to another embodiment, the control circuit is constructed in such a manner that, in the second memory configuration, it sets the signaling bit in the register with a first state when the first address connections are driven by a first state of a control signal and sets the signaling bit with a second state if the first address connections are driven by a second state of the control signal. In this arrangement, the register is preferably constructed as a mode register of a DRAM semiconductor memory device.

A method for operating an integrated semiconductor memory is also provided in accordance with the invention. The method includes using an integrated semiconductor memory device that can be operated in a first memory configuration and a second memory configuration. The integrated semiconductor memory used has memory cells in a first memory zone and in a second memory zone. It has first address connections that apply first address signals and a second address connection that apply a second address signal. One of the memory cells in the first or second memory zone can be selected by applying the first address signals to the first address connections and by applying the second address signals to the second address connection in the first memory configuration. A signaling bit in a mode register, by which an access to the first or the second memory zone can be selected, can be set by applying a control signal to the first address connections in the second memory configuration. When the integrated semiconductor memory cannot be driven by a memory controller at its second address connection, it is configured for operation in the second memory configuration. When it is intended to access the first memory zone, a signaling bit is then set with a first state in the mode register of the integrated semiconductor memory. In contrast, when it is intended to access the second memory zone, the signaling bit is set with a second state in the mode register of the integrated semiconductor memory. Following that the first address connections are driven with first address signals that select a memory cell in the second memory zone. Following that, a data item is read out of the selected memory cell or a data item is written into the selected memory cell.

In an embodiment of the method for operating the integrated semiconductor memory device, the integrated semiconductor memory is initialized in the second memory configuration by connecting the second address connection to a voltage potential.

In another embodiment of the method according to the invention for operating the integrated semiconductor memory device, the integrated semiconductor memory device is initialized in the first memory configuration by driving a control circuit of the integrated semiconductor memory device with a first state of the configuration signal. The integrated semiconductor memory device is initialized in the second memory configuration by driving the control circuit of the integrated semiconductor memory with a second state of the configuration signal.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
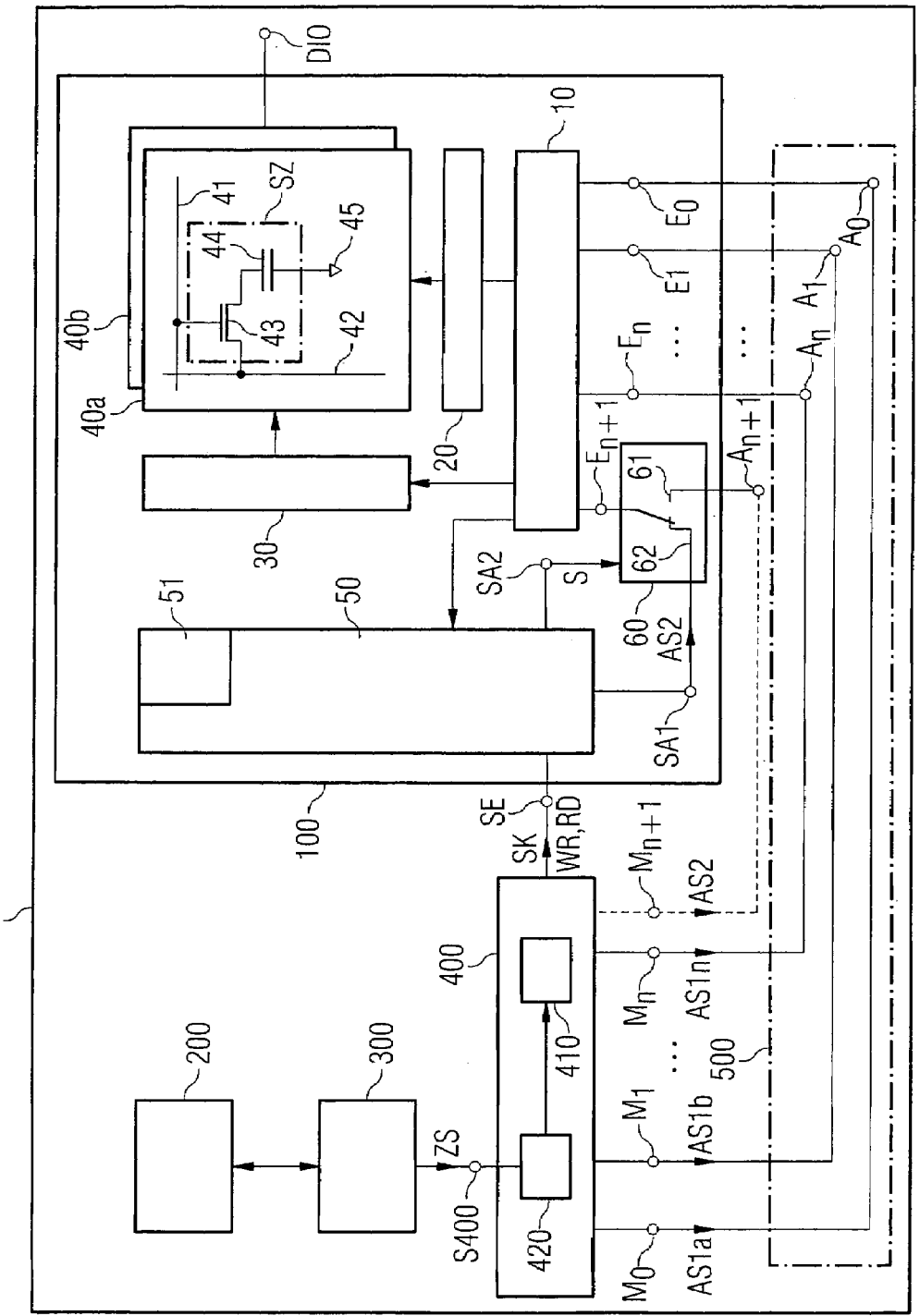
FIG. 1 shows a motherboard of a computer with an integrated semiconductor memory device according to an embodiment of the invention.

FIG. 1 shows a motherboard 1 of a computer which contains an integrated semiconductor memory device 100 which, for example, is constructed as DRAM memory, a BIOS memory 200, a processor 300 and a memory controller 400. The integrated semiconductor memory can be operated in a first and second memory zone. The integrated semiconductor memory 100 includes an address register 10 with first input connections $E_0, E_1, \ldots, E_n, E_{n+1}$ that apply first address signals $AS1a, \ldots, AS1n$, and a second input connection $E_{n+1}$ that apply a second address signal AS2. The address register 10 drives a column decoder 20 and a row decoder 30. Via the column and row decoder, a memory cell SZ can be selected which is located in a first memory zone 40a or in a second memory zone 40b.

In FIG. 1, a DRAM memory cell SZ is shown in the first memory zone 40a, for example. The memory cell includes a selection transistor 43 which is connected to a storage capacitor 44 and a bit line 42. The storage capacitor 44 is connected to a reference potential 45. The selection transistor 43 is connected to a word line 41 via its control connection. If, for example, the memory cell SZ is selected, the potential on the word line 41 which is connected to the selection transistor 43 of the memory cell is adjusted, for reading information in or out, in such a manner that the selection transistor 43 is switched into its conductive state. As a result, the capacitor 44 is connected at low impedance to the bit line 42. During the read process, a charge stored in the capacitor flows away. During the write process, the storage capacitor is charged up via the bit line. The charge stored in the storage capacitor represents the stored information. The information can be read in or out via a bidirectional data connection DIO.

The integrated semiconductor memory device 100 also includes a control circuit 50 and a controllable switch 60. The controllable switch 60 can be operated in a first switch position 61 and a second switch position 62. In the first switch position 61, it connects a first output connection SA1 of the control circuit 50 to the second input connection $E_{n+1}$ of the address register 10. In the second switch position 62, it connects the second address connection $A_{n+1}$ to the second input connection $E_{n+1}$ of the address register 10. The controllable switch can be controlled via a control signal S which is provided by the control circuit 50 at a second output connection SA2. Furthermore, the control circuit 50 includes an input connection SE that applies a configuration signal SK and also control signals RD and WR which are generated by the memory controller 400 at its output.

The memory controller is driven by an access signal ZS from the processor 300 via a control connection S400. It represents the interface between processor and semiconductor memory and handles the controlling of the semiconductor memory in dependence on the drive by the processor. It includes a control circuit 410 and a register 420. The control circuit 410 generates the configuration signal SK by which the controller can select whether the memory is to be operated in the first or the second memory configuration, and the further control signals RD and WR that activate a read and write access to memory cells of the integrated semiconductor memory. The memory controller also includes output address connections $M_0, M_1, \ldots, M_n$ to generate the first address signals $AS1a, \ldots, AS1n$ which are supplied to the first address connections $A_0, A_1, \ldots, A_n$ of the semiconductor memory 100 via an address bus 500.

Memory controllers of a later generation additionally include a further output address connection $M_{n+1}$ to generate the second address signal AS2 which drives the second address connection $A_{n+1}$ of the integrated semiconductor memory. In such a case, the integrated semiconductor memory can be operated in the first memory configuration. The memory controller can use the address signal AS2 for selecting whether the first memory zone 40a or the second expanded memory zone 40b, for example an additional memory bank, is accessed. Operation of the integrated semiconductor memory in the first memory configuration is shown dashed in FIG. 1.

When the semiconductor memory is operated in the second memory configuration, the connection $A_{n+1}$ of the integrated semiconductor memory is not driven by the memory controller. Such a case occurs when the integrated semiconductor memory according to the invention is used on the board of a computer, the memory controller of which does not have the necessary number of output address connections. The output address connection $M_{n+1}$, shown dashed in FIG. 1, of the memory controller does not exist in this case.

Figure 2:
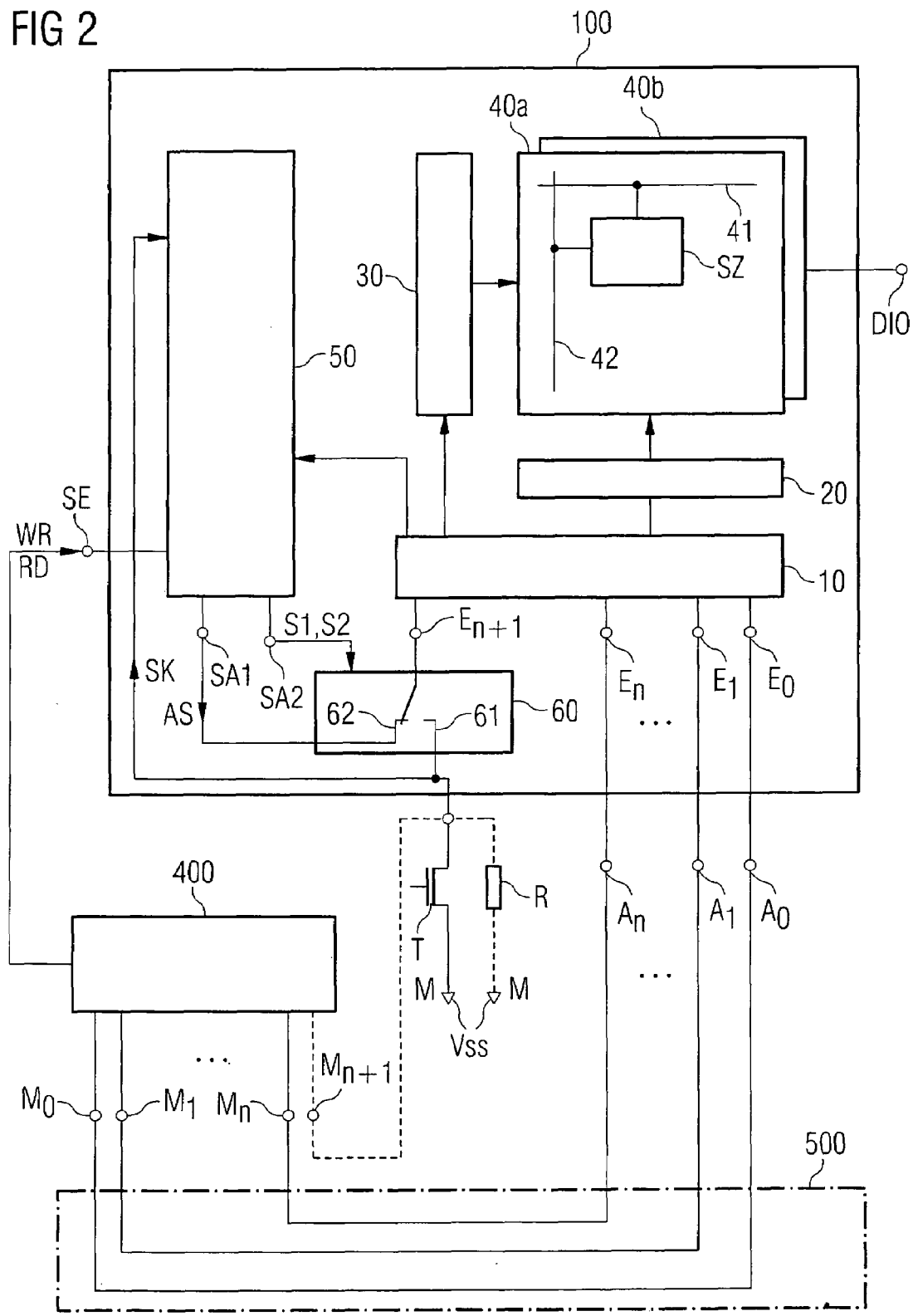
FIG. 2 shows an integrated semiconductor memory device that is driven by a memory controller.

FIG. 2 shows an integrated semiconductor memory device 100 according to a further embodiment of the invention. The integrated semiconductor memory is located on the motherboard of a computer. For the sake of simplicity, only the memory controller 400 is shown here as component of the motherboard. If the output address connections of the memory controller are compatible with the integrated semiconductor memory, the second address connection $A_{n+1}$ of the semiconductor memory is also connected with the output address connection $M_{n+1}$ of the memory controller in this case as in FIG. 1. If, however, there is no compatibility with respect to the address connections, the second address connection $A_{n+1}$ is connected to a connection M that applies a reference potential Vss via a transistor T in this embodiment of the integrated semiconductor memory. The reference potential can be, for example, the ground potential. The transistor T can also be replaced optionally by a bias resistor R. In this embodiment, the input connection SE of the control circuit is not driven by the configuration signal SK but only by the read and write commands RD and WR.

Figure 3:
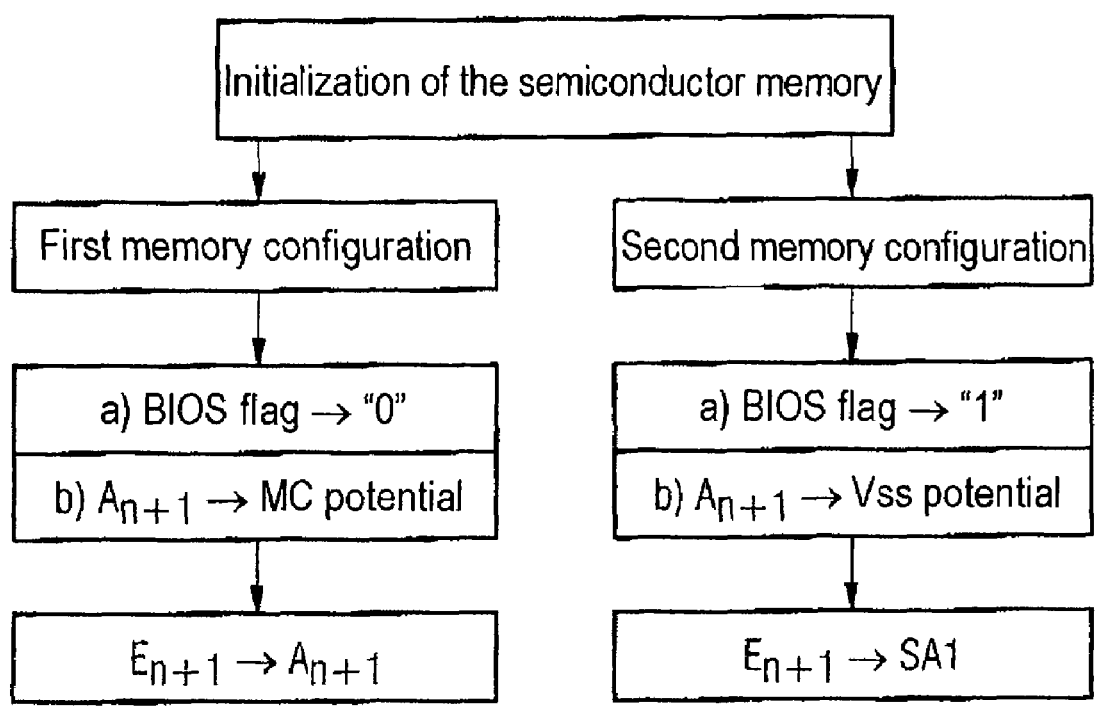
FIG. 3 shows a flowchart for performing an initialization of an integrated semiconductor memory device according to the invention.

The flowchart of FIG. 3 illustrates the initialization of the integrated semiconductor memory in accordance with two embodiments of FIGS. 1 and 2. The reference symbols used in the text which follows can be found in FIGS. 1 and 2.

Before a read or write access of the integrated semiconductor memory, the integrated semiconductor memory must be initialized. The initialization specifies whether the semiconductor memory is operated in the first or in the second memory configuration. When the computer or the semiconductor memory, respectively, are started up, the processor checks a bit in the BIOS memory 200 which specifies the memory configuration in which the integrated semiconductor memory is operated. If, for example, the corresponding bit in the BIOS memory has a binary state "0", the integrated semiconductor memory is operated in the first memory configuration. If, in contrast, the corresponding bit in the BIOS memory is set, that is to say has the binary state "1", the integrated semiconductor memory is operated in the second memory configuration. The memory configuration is then indicated to the integrated semiconductor memory itself and to the memory controller.

The processor indicates the memory configuration to the memory controller by writing a corresponding information item into the register 420. For example, the binary state "0" of a bit at a position in the register 420 marks that the integrated semiconductor memory is operated in the first memory configuration whereas the binary state "1" indicates that the semiconductor memory is operated in the second memory configuration.

To indicate the memory configuration to the integrated semiconductor memory, it is driven by the configuration signal SK from the memory controller at the input connection SE in accordance with the embodiment of FIG. 1. For this purpose, the memory controller first evaluates the register 420 into which an information item about the memory configuration has been written by the processor 300. Depending on the memory configuration in which the semiconductor memory is to be operated, the memory controller drives a control circuit 50 with a corresponding state of the configuration signal SK.

When the computer or the semiconductor memory, respectively, is started up, the control circuit 50 checks whether it is driven by a first or a second state of the configuration signal SK. If it is driven by the first state of the configuration signal, the integrated semiconductor memory is operated in the first memory configuration. If it is driven by the second state of the configuration signal, the integrated semiconductor memory is operated in the second memory configuration.

According to the embodiment shown in FIG. 2, the control circuit 50 checks the potential present at the second address connection $A_{n+1}$ when the computer or the semiconductor memory, respectively, is started up. If the integrated semiconductor memory is operated in the first memory configuration, the second address connection $A_{n+1}$ is connected to the output address connection $M_{n+1}$ provided for this purpose at the memory controller. The second address connection $A_{n+1}$ is driven by a memory controller potential (MC potential) identifying the first memory configuration in this case. If, however, the semiconductor memory is operated in the second memory configuration, the second address connection $A_{n+1}$ is not connected to the output address connection $M_{n+1}$ of the memory controller. Depending on embodiments of the FIG. 2, the second address connection $A_{n+1}$ is connected to the reference potential Vss via the switching transistor T, which is controlled to conduct, or the second address connection $A_{n+1}$ is connected to the reference potential Vss via the bias resistor R. If the control circuit thus detects the reference potential or, respectively, the reference potential reduced by a corresponding voltage drop across a bias resistor R or across a switching transistor T, respectively, during the starting up, it is operating the integrated semiconductor memory in the second memory configuration.

If the integrated semiconductor memory is operated in the first memory configuration, the control circuit 50 controls a controllable switch 60 into the first switch position 61 with the aid of the control signal S so that the second input connection $E_{n+1}$ of the address register 10 is in signal connection with the second external address connection $A_{n+1}$ of the integrated semiconductor memory.

If the integrated semiconductor memory is operated in the second memory configuration, the control circuit 50, after being driven by the memory controller 400 with the second state of the configuration signal SK or after detecting a corresponding potential state at the second address connection $A_{n+1}$, generates a control signal S with a state so that the controllable switch 60 is controlled into the second switch position 62. In the second switch position 62, the input connection $E_{n+1}$ of the address register 10 is connected to the first output connection SA1 of the control circuit 50.

Figure 4:
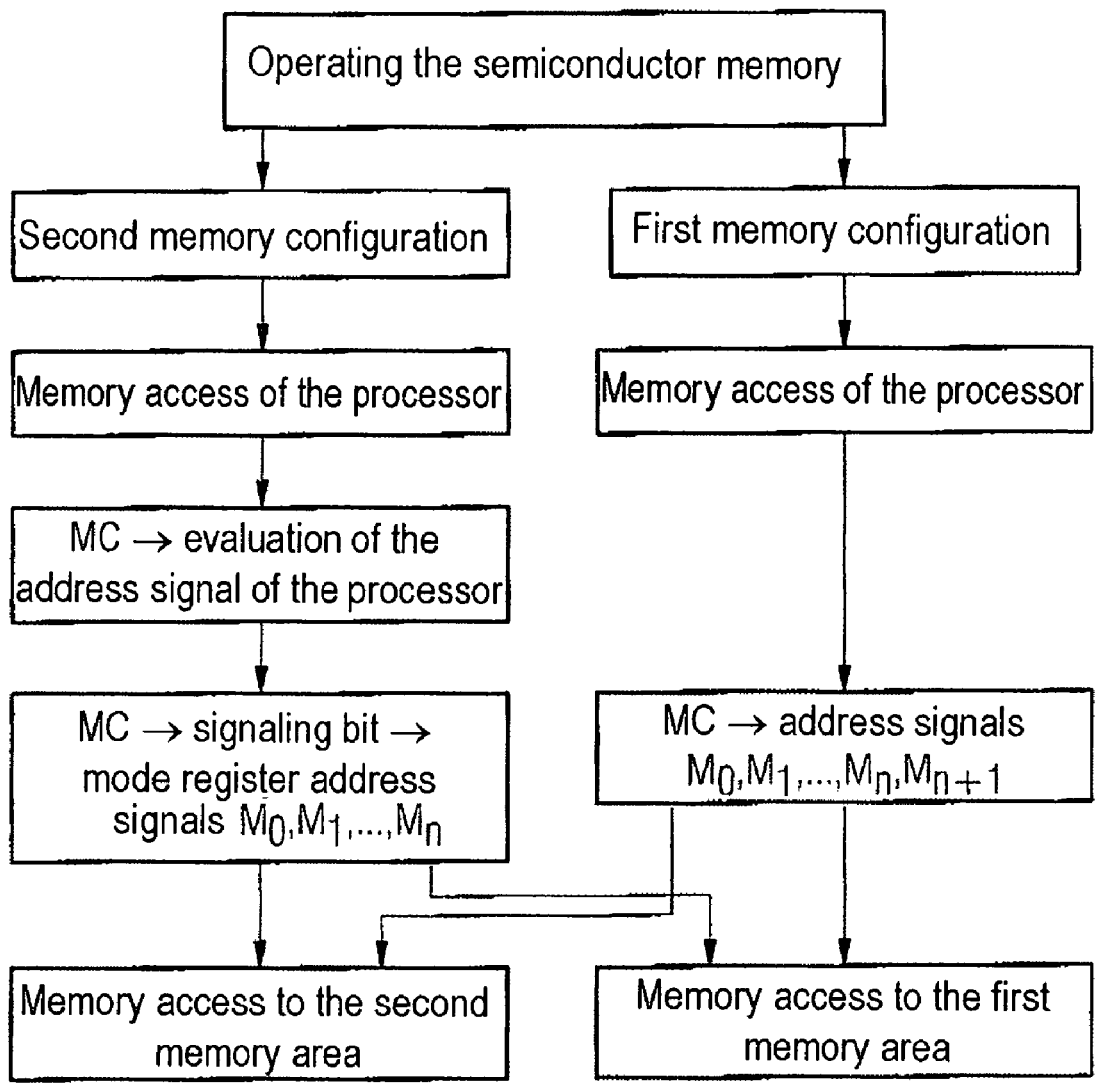
FIG. 4 shows a flowchart for performing a memory access on an integrated semiconductor memory device according to the invention.

The flowchart of FIG. 4 describes the operation of the integrated semiconductor memory according to the invention in the first and second memory configuration. In the first memory configuration, all external address connections $A_0$, . . . , $A_{n+1}$ are driven by the output address connections $M_0$, . . . , $M_{n+1}$ of the memory controller since the memory controller is compatible with the semiconductor memory chip with respect to the number of available driver channels. The memory controller can thus address each memory cell of the first and second memory zone via its output address connections. In this arrangement, the state of the address signal at its output address connection $M_{n+1}$ specifies whether the first memory zone or the first memory bank 40a, respectively, or the second memory zone or the second memory bank 40b, respectively, is being accessed. The state of the address signal at the output address connections $M_0$, . . . , $M_n$ specifies which memory cell within one of the two memory zones 40a or 40b is being accessed.

If the second address connection $A_{n+1}$ cannot be driven with the second address signal AS2 via the memory controller due to the limited number of available driver channels of the bus 500 or due to the limited number of output address connections of the memory controller, that is to say, for example, when there is no output address connection $M_{n+1}$, the integrated semiconductor memory is operated in the second memory configuration. In this configuration, the processor accesses its logical address zone as before. If the memory controller has first been configured in the second memory configuration and receives an access command ZS for the first memory zone from the processor via the control connection S400, it sets a signaling bit with a first state which indicates to the control circuit 50 the access to the first memory zone, within a register 51 of the semiconductor memory. The first address connections $A_0$, . . . , $A_n$ are driven by the output address connections $M_0$, . . . , $M_n$ of the memory controller as in the first memory configuration for selecting a memory cell in the first memory zone.

If the memory controller, after its control connection S400 has been driven by the access signal ZS of the processor, finds that it is intended to access a memory cell in the second memory zone, it sets the signaling bit within the register 51 of the semiconductor memory with a second state which indicates the access to the second memory zone to the control circuit 50. The first address connections $A_0$, . . . , $A_n$ are driven by the output address connections $M_0$, . . . , $M_n$ of the memory controller for selecting a memory cell within the second memory zone.

When it is operated in the second memory configuration, therefore, the second address signal AS2 is not generated directly by the memory controller but the control circuit 50 generates the second address signal AS2 at the first output connection AS1. Since thus all input connections $E_0$, . . . , $E_{n+1}$ of the address register 10 are driven by the address signals AS1a, ..., AS1n, AS2 both in the first and in the second memory configuration, the address register 10 and all other circuit components driven by it such as, for example, the column decoder 20 or the row decoder 30, can be operated independently of the first or second memory configuration.

The second address signal AS2 generally represents a bit information item. The control circuit generates, for example, the second address signal with a binary "0" if the signaling bit in the register 51 has been set in the first state by the memory controller, or it generates the second address signal with a binary "1" if the signaling bit in the register 51 has been set in the second state by the memory controller.

The mode register or the extended mode register can be preferably used as register 51. For setting the signaling bit within this register, the memory controller delivers a special command, the so-called mode register set command or the extended mode register set command. This is a bit sequence which is generally applied to the address connections $A_0$, ..., $A_n$ by the memory controller.

It is possible to provide special programs for interaction with the memory according to the invention, which control the access to the first or second memory zone. The software essentially controls the access to registers already existing in the memory controller which are used for executing the mode register set command. The software thus provides for switching between the first and second memory zone. This second memory zone can be used, for example, as fast RAM disk.

Similarly, the access to the second memory zone can also be controlled and advantageously utilized by the operating system. In this arrangement, implementations of the operating system already in existence can be used. The only changes relate to the switch-over commands between the first and second memory zone, that is to say, for example, the mode register set command.

Currently, unused memory zone within a memory cell array is transferred to the hard disk by the operating system so that it is thus available to other programs. Although this method extends the usable memory zone, it has the disadvantage that it is very slow since the access times to the hard disk are generally relatively long. In the integrated semiconductor memory according to the invention, the unused memory can be transferred by the operating system, for example into the second memory zone. As a result, no further hard disk access is needed. Instead of the hard disk access, a single command, for example the mode register set command, is used for switching to the second memory zone. The memory content thus no longer needs to be transferred or shifted which significantly reduces the access times.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE DESIGNATIONS

1 Main board (motherboard)
10 Address register
20 Column decoder
30 Row decoder
40 Memory zone
41 Word line
42 Bit line
43 Selection transistor
44 Storage capacitor
45 Connection for applying a reference potential
50 Control circuit
51 Mode register
60 Controllable switch
61, 62 Switch positions
100 Integrated semiconductor memory
200 BIOS memory
300 Processor
400 Memory controller (MC)
410 Control circuit
420 Register
500 Address bus
AS Address signal
WR Write signal
RD Read signal
ZS Access signal of the processor
SK Signal for specifying the memory configuration
SE Input connection of the control circuit
M Output connection of the MC for addresses
A Address connection
E Input connection of the address register
SA Output connection of the control circuit
S Control signal of the control circuit
DIO Connection for data input/output
T Transistor
R bias resistor
Vss Ground potential
SZ Memory cell

What is claimed:

1. An integrated semiconductor memory device that can be operated in a first and second memory configuration, the integrated semiconductor memory device comprising:
   a plurality of memory cells that are arranged in a first memory zone and in a second memory zone;
   a register that stores a signaling bit for identifying an access to the first memory zone or the second memory zone;
   a plurality of first address connections that apply first address signals so as to select one of the memory cells within the first or second memory zone for access via the first address signals;
   a second address connection that applies a second address signal; and
   a control circuit to control the integrated semiconductor memory device;
   wherein the control circuit is configured to access the first memory zone or the second memory zone based upon the second address signal present at the second address connection in the first memory configuration of the integrated semiconductor memory device, and the control circuit is configured to access the first memory zone or the second memory zone based upon a state of the signaling bit in the second memory configuration of the integrated semiconductor memory device.

2. The integrated semiconductor memory device of claim 1, further comprising:
   an address register including a plurality of first input connections and a second input connection;
   wherein:
      each of the first address connections is connected with a corresponding one of the first input connections of the address register;

the second address signal present at the second address connection is supplied to the second input connection of the address register in the first memory configuration; and the control circuit includes a first output connection to output the second address signal, and the first output connection of the control circuit is connected to the second input connection of the address register in the second memory configuration.

3. The integrated semiconductor memory device of claim 2, further comprising a controllable switch, wherein the control circuit includes a second output connection to output a control signal for controlling the controllable switch such that, in the first memory configuration, the second address signal present at the second address connection is supplied to the second input connection of the address register via the controllable switch, and, in the second memory configuration, the first output connection of the control circuit is connected to the second input connection of the address register via the controllable switch.

4. The integrated semiconductor memory device of claim 1, wherein the control circuit includes an input connection that applies a configuration signal for initializing the integrated semiconductor memory device such that the control circuit operates the integrated semiconductor memory device based upon a state of the configuration signal.

5. The integrated semiconductor memory device of claim 1, wherein the control circuit is configured to operate the integrated semiconductor memory device in the second memory configuration when the second address signal is present at the second address connection with a potential state.

6. The integrated semiconductor memory device of claim 5, wherein the second address connection is connected to a connection that applies the potential state via one of a transistor and a bias resistor.

7. The integrated semiconductor memory device of claim 6, wherein the connection that applies the potential state is configured to apply a ground potential.

8. The integrated semiconductor memory device of claim 1, wherein the control circuit is configured such that, in the second memory configuration, the control circuit sets the signaling bit in the register with a first state when the first address connections are driven by a first state of a control signal, and the control circuit sets the signaling bit with a second state when the first address connections are driven by a second state of the control signal.

9. The integrated semiconductor memory device of claim 8, wherein the register comprises a mode register of a DRAM semiconductor memory.

10. A method for operating an integrated semiconductor memory device, the method comprising:

providing an integrated semiconductor memory device that is operable in a first memory configuration and a second memory configuration, the integrated semiconductor memory device including a plurality of memory cells in a first memory zone and in a second memory zone, a mode register, first address connections that apply first address signals and a second address connection that applies a second address signal, wherein one of the memory cells in the first memory zone or the second memory zone is selectable by applying first address signals to the first address connections and by applying second address signals to the second address connection in the first memory configuration, and wherein a signaling bit in the mode register, which controls access to the first memory zone or the second memory zone, is set by applying a control signal to the first address connections in the second memory configuration;

initializing the integrated semiconductor memory device for operating in the second memory configuration;

after initialization, setting the signaling bit to a first state in the mode register to access a memory cell in the first memory zone or setting the signaling bit to a second state in the mode register to access a memory cell in the second memory zone;

after the setting of the signaling bit, driving the first address connections with first address signals so as to select a memory cell in the second memory zone; and following the driving of the first address connections, reading a data item out of the selected memory cell or writing a data item into the selected memory cell.

11. The method of claim 10, further comprising:

initializing the integrated semiconductor memory device in the second memory configuration by connecting the second address connection to a voltage potential.

12. The method of claim 10, further comprising:

initializing the integrated semiconductor memory in the first memory configuration by driving a control circuit of the integrated semiconductor memory device with a configuration signal in a first state;

initializing the integrated semiconductor memory in the second memory configuration by driving the control circuit of the integrated semiconductor memory with the configuration signal in a second state.

* * * * *